(12) United States Patent
Sato et al.

(10) Patent No.: US 8,105,461 B2
(45) Date of Patent: Jan. 31, 2012

(54) METHOD FOR DISASSEMBLING BONDED STRUCTURE

(75) Inventors: Mitsuru Sato, Suwa (JP); Takatoshi Yamamoto, Suwa (JP)

(73) Assignee: Seiko Epson Corporation (JP)

( * ) Notice: Subject to any disclaimer, the term of this patent is extended or adjusted under 35 U.S.C. 154(b) by 480 days.

(21) Appl. No.: 12/414,775

(22) Filed: Mar. 31, 2009

(65) Prior Publication Data

US 2009/0250168 A1 Oct. 8, 2009

(30) Foreign Application Priority Data

Apr. 7, 2008 (JP) .................................. 2008-099742

(51) Int. Cl.
*B32B 38/10* (2006.01)

(52) U.S. Cl. ........................... 156/711; 156/712; 156/752

(58) Field of Classification Search .................. 156/711, 156/712, 713, 752, 753
See application file for complete search history.

(56) References Cited

U.S. PATENT DOCUMENTS 5,753,720 A 5/1998 Nakanishi et al.
(Continued)

FOREIGN PATENT DOCUMENTS

JP 05-82404 4/1993
(Continued)

OTHER PUBLICATIONS

Mitsuo Toyama, "Pressure-Sensitive Adhesive Agents—Their Functionality and Mechanism", pp. 238-247, Feb. 20, 1991.

*Primary Examiner* — Philip Tucker
*Assistant Examiner* — Nickolas Harm
(74) *Attorney, Agent, or Firm* — Harness, Dickey & Pierce, P.L.C.

(57) ABSTRACT

There is provided a method for disassembling a bonded structure obtained by bonding a first base member and a second base member to each other via a bonding film mainly made of a compound having a branched polyorganosiloxane skeleton having a structural unit expressed by a following general formula (1) at a terminal portion, a structural unit expressed by a following general formula (2) at a linking portion, and a structural unit expressed by a following general formula (3) at a branched portion:

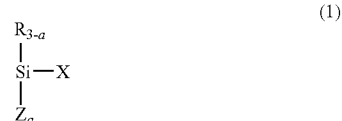

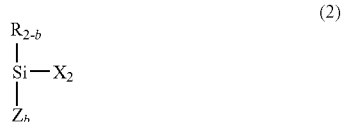

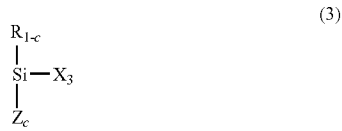

In the formulas, each R independently represents a non-substituted hydrocarbon group; each Z independently represents a hydroxyl group or a hydrolytic group; each X represents a siloxane residue; a represents 0 or an integer of 1 to 3; b represents 0 or an integer of 1 or 2; and c represents 0 or 1. The disassembling method includes heating the bonding film into a molten state at a temperature equal to or higher than a glass transition point of the compound having the branched polyorganosiloxane skeleton and separating the first and the second base members from each other.

10 Claims, 8 Drawing Sheets

U.S. PATENT DOCUMENTS 6,890,601 B2    5/2005    Griswold et al.

FOREIGN PATENT DOCUMENTS

| JP | 07-179828 | | 7/1995 |
| JP | 09-208829 | | 8/1997 |
| JP | 2003-119439 | * | 4/2003 |
| JP | 2004-002549 | * | 1/2004 |
| JP | 2004-502021 | | 1/2004 |
| JP | 2007-063571 | * | 3/2007 |
| JP | 2007-204576 | * | 8/2007 |

* cited by examiner

METHOD FOR DISASSEMBLING BONDED STRUCTURE

The entire disclosure of Japanese Patent Application No. 2008-099742, filed Apr. 7, 2008 is expressly incorporated by reference herein.

BACKGROUND

1. Technical Field

The present invention relates to a method for disassembling a bonded structure.

2. Related Art

Conventionally, in order to form a bonded structure by bonding two members together, the members are often bonded to each other by interposing a bonding layer made of an adhesive such as a urethane or an epoxy based one between the members.

When bonding the members to each other via the bonding layer, there are problems such as poor size precision and time-consuming curing. Thus, as an alternative to the conventional method, JP-A-1993-82404 has proposed a method for bonding solids, as an example of a method for directly bonding two members together without using any adhesive.

The methods as above are generally used to bond two members to each other. Meanwhile, recently, there has been a demand for post-use recycling of bonded structures from a viewpoint of environmental resources.

In order to improve a recycling rate for a bonded structure, members included in the structure need to be separated from each other for recycling use. However, for bonded structures obtained using the bonding methods described above, no efficient technique has been proposed to separate the members from each other. Consequently, the recycling rate for such bonded structures has remained low.

SUMMARY

An advantage of the present invention is to provide a method for disassembling a bonded structure that can easily and efficiently separate two members from each other in a bonded structure obtained by bonding together the two members via a bonding film therebetween.

The advantage of the invention is accomplished by following aspects and features.

According to an aspect of the invention, there is provided a method for disassembling a bonded structure obtained by bonding a first base member and a second base member to each other via a bonding film mainly made of a compound having a branched polyorganosiloxane skeleton having a structural unit expressed by a following general formula (1) at a terminal portion, a structural unit expressed by a following general formula (2) at a linking portion, and a structural unit expressed by a following general formula (3) at a branched portion:

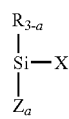  (1)

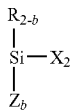  (2)

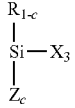  (3)

where each R independently represents a non-substituted hydrocarbon group; each Z independently represents a hydroxyl group or a hydrolytic group; each X represents a siloxane residue; a represents 0 or an integer of 1 to 3; b represents 0 or an integer of 1 or 2; and c represents 0 or 1. The disassembling method according to the aspect includes heating the bonding film into a molten state at a temperature equal to or higher than a glass transition point of the compound having the branched polyorganosiloxane skeleton and separating the first and the second base members from each other.

In the method above, the binding film is mainly made of the compound having the branched polyorganosiloxane skeleton. Thus, heating the binding film at a temperature equal to or higher than the glass transition point of the branched compound causes the film to become molten, whereby the first and the second base members can be easily and efficiently separated from each other.

Preferably, the compound having the branched polyorganosiloxane skeleton has a molecular weight ranging from $1 \times 10^4$ to $1 \times 10^6$.

The branched compound having the molecular weight set in the range has the glass transition point where the compound surely remains in a solid form at room temperature and is molten when heated. In addition, a heating temperature can be set equal to or lower than a temperature causing degeneration or deterioration in the first and the second base members.

Preferably, the bonding film is heated at a temperature ranging from 90 to 200° C.

Heating the bonding film at a temperature in the range can surely prevent degeneration and deterioration of the first and the second base members due to heating and also can further ensure that the bonding film is melted into a molten state.

Preferably, the bonded structure is obtained by supplying a liquid material mainly including the compound having the branched polyorganosiloxane skeleton on at least one of the first and the second base members to form a liquid coating film; drying the liquid coating film at a temperature not exceeding 40° C. to form the bonding film on the at least one of the first and the second base members; and applying a compressive force to both the first and the second base members in a condition where the bonding film is interposed between the base members, so as to bond the base members to each other via the bonding film.

Thereby, the bonded structure formed can be applied to the disassembling method of the aspect.

In addition, the bonding film is formed while maintaining properties of the compound having the branched polyorganosiloxane skeleton. Accordingly, when the bonded structure including the bonding film thus formed is applied to the disassembling method of the aspect, the bonding film can be more surely molten by heating at a temperature equal to or higher than the glass transition point of the branched compound.

Preferably, the bonding film is heated when applying the compressive force.

Thereby, heating energy is applied to the bonding film. This further promotes bonding of the bonding film to the base member by application of the compressive force.

In that case, preferably, the binding film is heated at a temperature ranging from 40 to 200° C.

This can surely prevent degeneration and deterioration of the first and the second base members due to heat, as well as can further promote bonding of the bonding film to the base member to be bonded, thereby ensuring increase in a bonding strength between the film and the member.

Preferably, the liquid material is prepared using a solvent having a vapor pressure ranging from 10 to 800 Torr at 40° C.

Thereby, when drying the liquid coating film at a temperature not exceeding 40° C., the solvent can be immediately and surely removed from the liquid coating film even if the liquid coating film is not exposed to a reduced pressure atmosphere. Thus, the bonding film can be immediately and surely formed on the base member where the bonding film is to be formed.

Preferably, the compressive force ranges from 0.2 to 10 MPa.

This can ensure bonding of the bonding film to the base member to be bonded.

Preferably, the bonding film formed using the liquid coating film has an average thickness ranging from 10 to 10,000 nm.

This allows the bonding film to be immediately molten. Thus, separation between the first and the second base members can be achieved without causing degeneration, deterioration, or the like in the base members.

Preferably, the bonding film is formed on both the first and the second base members.

In the bonded structure obtained by the steps above, the bonding films formed on the base members are integrated with each other to bond the base members together. This can further enhance the bonding strength between the base members.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the invention will be described in detail with reference to the accompanying drawings.

Method for Disassembling Bonded Structure

First, there will be described a bonded structure applied to a method for disassembling a bonded structure (hereinafter simply referred to as "disassembling method") according to the embodiment of the invention, followed by a description of the disassembling method of the embodiment.

Figure 1:
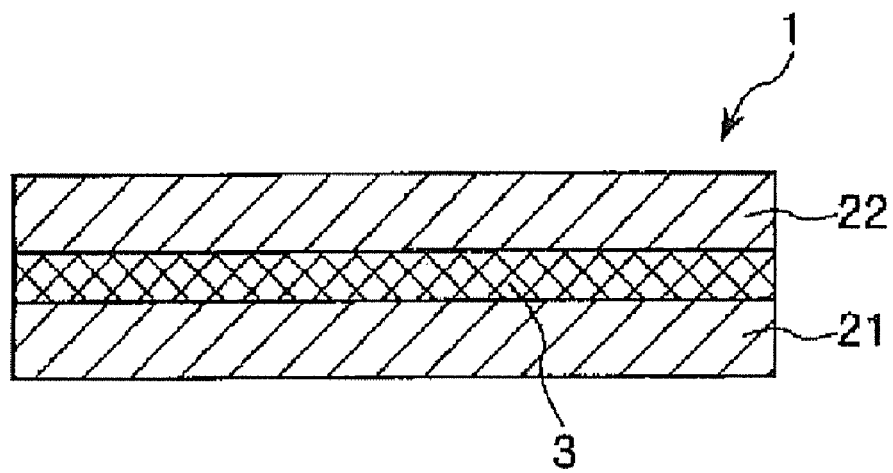
FIG. 1 is a longitudinal sectional view showing an example of a bonded structure applied to a method for disassembling a bonded structure according to an embodiment of the invention.
Figure 2A:
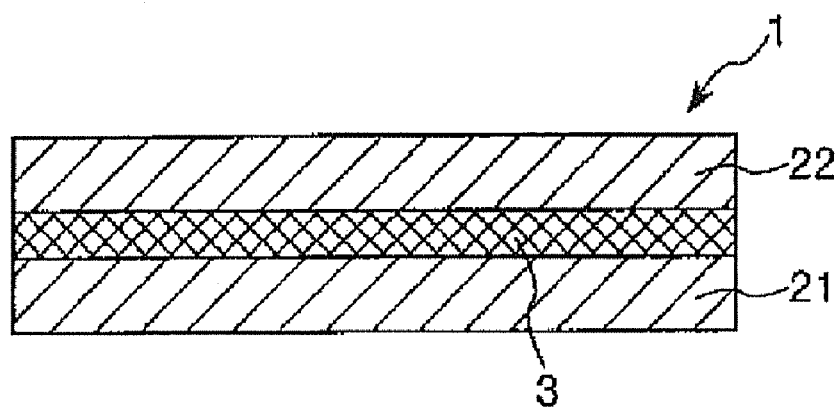
FIGS. 2A to 2C are diagrams (longitudinal sectional views) for illustrating a process for disassembling the bonded structure of FIG. 1 by using the disassembling method of the embodiment.
Figure 2B:
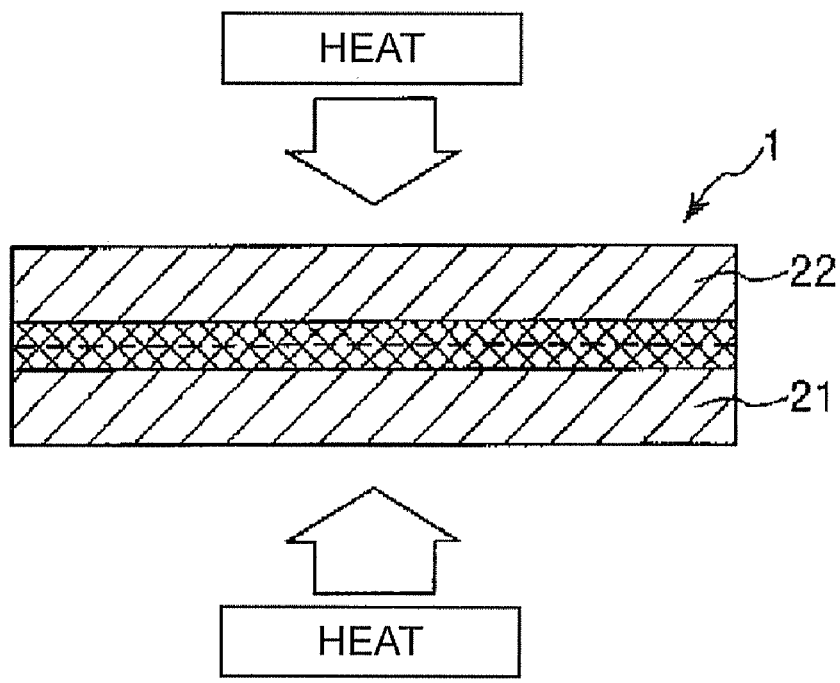
Figure 2C:
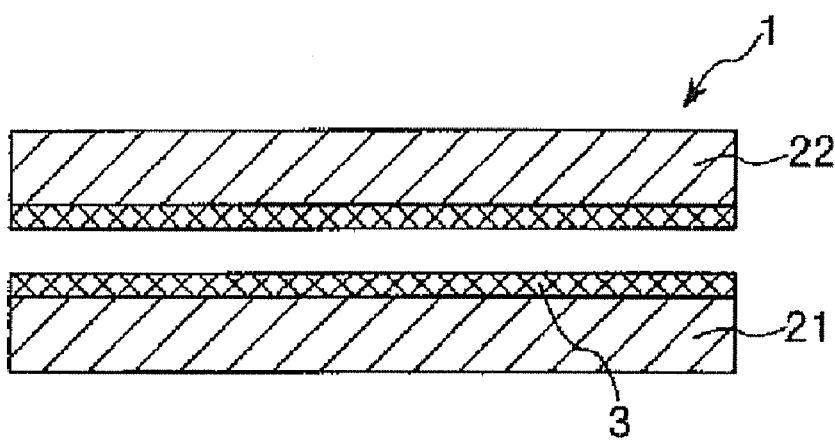

FIG. 1 is a longitudinal sectional view showing an example of the bonded structure applied to the disassembling method of the embodiment. FIGS. 2A to 2C are longitudinal views for illustrating a process of disassembling the bonded structure of FIG. 1 by using the disassembling method of the embodiment. In the description below, upper and lower sides, respectively, in FIG. 1 and FIGS. 2A to 2C are referred to as "upper" and "lower", respectively, of the embodiment.

A bonded structure 1 shown in FIG. 1 includes a first base member 21, a second base member 22, and a bonding film 3 interposed between the base members 21 and 22.

The first and the second base members 21 and 22 are bonded to each other via the bonding film 3 interposed therebetween.

Preferable materials for the first and the second base members 21 and 22 are those causing no degeneration, deterioration, or the like in the base members when heating the bonding film 3 into a molten state by applying the disassembling method of the embodiment. Using such materials for the base members can improve a recycling rate for the first and the second base members 21 and 22 in separation between the base members performed by applying the disassembling method of the embodiment.

Specifically, examples of the materials for the first and the second base members 21 and 22 mentioned above include metals such as Fe, Ni, Co, Cr, Mn, Zn, Pt, Au, Ag, Cu, Pd, Al, W, Ti, V, Mo, Nb, Zr, Pr, Nd, and Sm, or alloys of those metals, metallic materials such as carbon steel, stainless steel, indium-tin oxide (ITO), and gallium arsenide, silicons such as monocrystalline silicon, polycrystalline silicon, and amorphous silicon, glasses such as silica glass (quartz glass), alkali silicate glass, soda-lime glass, lime-potash glass, lead (alkali) glass, barium glass, and borosilicate glass, ceramics such as alumina, zirconia, $MgAl_2O_4$, ferrite, silicon nitride, aluminum nitride, boron nitride, titanium nitride, silicon carbide, boron carbide, titanium carbide, and tungsten carbide, carbons such as graphite, and composite materials formed by combining one or two or more kinds of those materials.

The first and the second base members 21 and 22 may be made of a same material or a different material. Even in separation between the base members made of a different material, applying the disassembling method of the embodiment can ensure improvement in the recycling rate for the base members 21 and 22.

The bonding film 3 is interposed between the first and the second base members 21 and 22 to bond the base members to each other.

In the embodiment, the bonding film 3 is mainly made of a compound having a branched polyorganosiloxane skeleton having a structural unit expressed by a following general formula (1) at a terminal portion, a structural unit expressed by a following general formula (2) at a linking portion, and a structural unit expressed by a following general formula (3) at a branched portion.

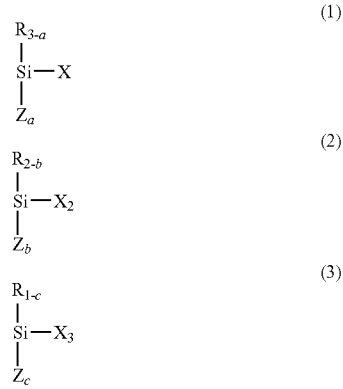

In the above formulas, each R independently represents a non-substituted hydrocarbon group; each Z independently represents a hydroxyl group or a hydrolytic group; each X represents a siloxane residue; a represents 0 or an integer of 1 to 3; b represents 0 or an integer of 1 or 2; and c represents 0 or 1.

The compound having the branched polyorganosiloxane skeleton (hereinafter sometimes referred to as "branched compound") has a main skeleton (a mina chain) mainly formed by repeated organosiloxane units, where the repetition of the organosiloxane units is branched at a halfway portion of the main chain and opposite terminals of the main chain are not linked to each other.

The branched compound formed as above, which is in a solid state at room temperature and becomes molten when heated, has a glass transition point. Specifically, the compound serves as an adhesive in the solid state, whereas, at temperatures equal or higher than the glass transition point, the compound is molten and does not adhesive properties. Accordingly, unlike epoxy adhesives, urethane adhesives, and the like, the bonding layer 3 mainly made of the branched compound can be heated into a molten state at a temperature equal to or higher than the glass transition point of the branched compound, so as to separate the second base member 22 from the first base member 21 in the bonded structure 1. The disassembling method uses such properties of the branched compound to separate the first and the second base members 21 and 22 from each other. Details of the method will be described later below.

Examples of a group indicated by R (the non-substituted hydrocarbon group) includes alkyl groups such as a methyl group, an ethyl group, and a propyl group, cycloalkyl groups such as a cyclopentyl group and a cyclohexyl group, aryl groups such as a phenyl group, a tolyl group, and biphenyl group, and aralkyl groups such as a benzyl group and a phenyl ethyl group.

The hydrolytic group may be an alkoxy group such as a methoxy group, an ethoxy group, a propoxy group, or a butoxy group, a ketoxime group such as a dimethyl ketoxime group or a methylethyl ketoxime group, an acyl-oxy group such as an acetoxy group, an alkenyl-oxy group such as an isopropenyl-oxy group or an isobutenyl-oxy group, or the like.

The branched compound has a molecular weight ranging preferably approximately from $1\times10^4$ to $1\times10^6$, and more preferably approximately from $1\times10^5$ to $1\times10^6$. Setting the molecular weight to a predetermined value in the range ensures that the branched compound is maintained in a solid state at room temperature and melted into a molten state by heating so as to have the glass transition point. A temperature for heating the compound can be set to a value equal to or lower than a temperature where degeneration or deterioration occurs in the first and the second base members 21 and 22.

Preferably, the branched compound as above has a silanol group. Specifically, in the structural units expressed by the above general formulas (1) to (3), the each group indicated by Z is preferably a hydroxyl group. Thereby, in a method for producing the bonded structure 1 described later below, when forming the bonding film 3 by drying a liquid coating film 30, hydroxyl groups adjacent in the branched compound are bound to each other. Thus, since the branched compound is a solid having a high film density at room temperature, the bonding film 3 formed has excellent film strength and exhibits high adhesiveness.

Preferably, the hydrocarbon group linked to a silicon atom of the silanol group is a phenyl group. Specifically, preferably, the each group R included in the structural units expressed by the above general formulas (1) to (3) including the each group Z as a hydroxyl group is a phenyl group. Thereby, reactivity of the silanol group is further improved, thereby further facilitating bonding between the adjacent hydroxyl groups in the branched compound.

Alternatively, preferably, the hydrocarbon group linked to the silicon atom of the silanol group is a methyl group. Specifically, preferably, the group R included in the structural units expressed by the general formulas (1) to (3) excluding the group Z is a methyl group. The compound including a methyl group as the group R included in the structural unit expressed by each of the general formulas (1) to (3) is relatively easily available at low cost and is a solid having a high film density at room temperature.

Considering from the hereinabove, for example, the branched compound is preferably a compound expressed by a following formula (4):

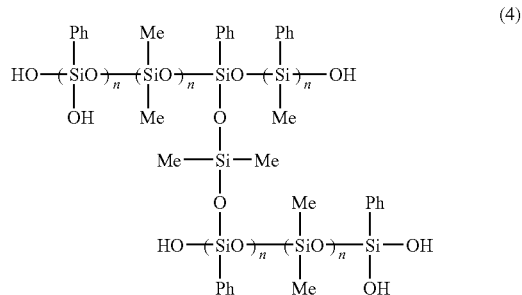

In the above formula, n each independently represents 0 or an integer equal to or greater than 1.

When the molecular weight ranges from approximately $1\times10^5$ to $1\times10^6$, the compound expressed by the formula (4) is a solid having a high film density at room temperature and has a glass transition point where the compound is molten under a temperature of approximately 90 to 100° C. Thus, the bonding film 3 exhibits an excellent bonding strength at room temperature and also is molten at the relatively low temperature of approximately 90 to 100° C. Thereby, the first and the second base members 21 and 22 can be separated from each other without causing any degeneration or deterioration in the base members.

In addition, the branched compound described above has high chemical resistance and thus can be effectively used to bond members together exposed to a chemical agent or the like for a long period of time. Specifically, for example, in production of a liquid droplet discharging head for an industrial inkjet printer using an organic ink apt to erode a resin material, applying the bonding film 3 mainly made of the branched compound to bonding together of members contact with the organic ink allow durability of the head to be surely improved. Furthermore, the branched compound is also highly heat-resistant and thus can be effectively used to bond members together exposed to a high temperature.

In the bonded structure 1 formed as above, the first base member 21 is separated from the second base member 22 by using the disassembling method in a manner as follows:

First, as described above, there is prepared the bonded structure 1 including the first base member 21 and the second base member 22 bonded together via the bonding film 3 mainly made of the branched compound (See FIG. 1A).

A method for forming the bonded structure 1 will be described in detail later below.

Next, the bonding film 3 of the bonded structure 1 is heated at a temperature equal to or higher than a glass transition point of a compound represented by the branched compound (See FIG. 2B).

In this case, as described above, the branched compound is in a solid state at room temperature and has the glass transition point where the compound is molten by heating. Accordingly, the bonding film 3 is molten by heating up to a temperature equal to or higher than the glass transition point of the branched compound, thereby allowing the first and the second base members 21 and 22 to be easily separated from each other (See FIG. 2C).

The temperature for heating the bonding film 3 of the bonded structure 1 is not restricted to a specific value only if it allows the bonding film 3 to be in a molten state. However, as described above, in the range of the molecular weight from approximately $1 \times 10^5$ to $1 \times 10^6$, the branched compound has the glass transition point where the compound is molten at the temperature of approximately 90 to 100° C. Thus, the temperature for heating the film is set in a range preferably approximately from 90 to 200° C., and more preferably approximately from 90 to 150° C. Heating the bonding film 3 at a predetermined temperature in the range enables the film to be more surely molten while surely preventing the first and the second base members 21 and 22 from being degenerated or deteriorated due to heating.

A heating time is not specifically restricted, but is preferably approximately 1 to 30 minutes, and is more preferably approximately 5 to 15 minutes. Thereby, the advantageous effects as above can be more remarkably exhibited.

In addition, the bonding film 3 may be heated at atmospheric pressure, but preferably at reduced pressure. Thereby, the bonding film 3 can be molten at lower temperature.

Specifically, a value of the reduced pressure ranges from preferably approximately $133.3 \times 10^{-5}$ to 1333 Pa ($1 \times 10^{-5}$ to 10 Torr), and more preferably approximately $133.3 \times 10^{-4}$ to 133.3 Pa ($1 \times 10^{-4}$ to 1 Torr). This further ensures that the bonding film 3 can be molten at lower temperature.

Thus, in the disassembling method of the embodiment, the first and the second base members 21 and 22 can be efficiently separated from each other by simply heating the bonding film 3 at a temperature equal to or higher than the glass transition point of the branched compound. Accordingly, when the base members are made of a different material, each base member can be separated for recycling use, thereby surely improving the recycling rate for the bonded structure 1.

Method for Forming Bonded Structure

For example, the bonded structure 1 described above is formed by bonding the first base member 21 to the second base member 22 via the bonding film 3 by applying a method for forming the bonded structure 1 as follows.

Specifically, first, there are prepared the first and the second base members 21 and 22. Then, on a surface of at least one of the base members 21 and 22 is supplied a liquid material 31 mainly containing the compound having the branched polyorganosiloxane skeleton to form the liquid coating film 30. Next, the liquid coating film 31 is dried at a temperature not exceeding 40° C. to form the bonding film 3 on the surface of the at least one of the first and the second base members 21 and 22. After that, while having the bonding film 3 interposed between the first and the second base members 21 and 22, a compressive force is applied to the base members to bond the base members to each other via the bonding film 3.

Hereinbelow, steps of each of a first configuration and a second configuration of the bonded-structure forming method will be described in detail. In the first configuration, the bonded structure 1 is obtained by selectively forming the bonding film 3 on the first base member 21 without forming o the second base member 22, whereas in the second method, the bonded structure 1 is obtained by forming the bonding film 3 on both the first and the second base members 21 and 22

First Configuration

FIGS. 3A to 3C and FIGS. 4D to 4F are longitudinal sectional views for illustrating the first method for forming the bonded structure 1. In the description below, upper and lower sides, respectively, in those drawings are referred to as "upper and lower", respectively.

In the first configuration of the bonded-structure forming method, the bonding film 3 is formed using the liquid material 31 selectively on the first base member 21 and not on the second base member 22. Then, the first and the second base members 1 and 22 are bonded together via the bonding film 3 to obtain the bonded structure 1.

Figure 3A:
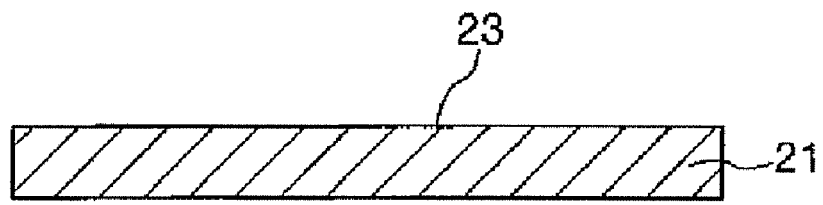
FIGS. 3A to 3C are diagrams (longitudinal sectional views) illustrating a first configuration of a method for forming the bonded structure shown in FIG. 1.

At step 1, first, the first and the second base members 21 and 22 as described above are prepared. In FIG. 3A, the second base member 22 is omitted.

In addition, a surface of each of the first and the second base members 21 and 22 may be subjected to a plating treatment such as Ni plating, a passivation treatment such as chromating, a nitriding treatment, or the like.

The first and the second base members 21 and 22 may be made of a same or different material, although the base members preferably have an approximately same thermal expansion rate. Allowing the base members 21 and 22 to have the approximately same thermal expansion rate leads to suppression of stress due to thermal expansion on a bonded interface between the base members bonded together. As a result, separation between the base members in the finally obtained bonded structure 1 can be surely prevented.

Preferably, the two base members 21 and 22 have a different rigidity. This allows the base members to be bonded more strongly.

Furthermore, preferably, at least one of the two base members 21 and 22 has flexibility, thereby enabling the bonding strength of the bonded structure 1 to be further improved. In addition, when the two base members 21 and 22 both are flexible, the obtained bonded structure 1 as a whole is flexible and highly functional.

It is only necessary for each of the base members 21 and 22 to have a surface supporting the bonding film 3. For example, the base members may be plate-shaped (layer-shaped), block- or bar-shaped.

The present embodiment uses the plate-shaped base members 21 and 22 as shown in FIGS. 3A to 4F. This facilitates flexion of each of the base members 21 and 22. Accordingly, when the two base members 21 and 22 are superimposed on each other, the members are sufficiently deformable along the mutual shape, thereby increasing adhesion between the two base members 21 and 22 superimposed on each other. As a result, the bonded structure 1 finally formed can have strong bonding strength.

Additionally, flexion of each of the base members 21 and 22 can serve to mitigate stress occurring on each bonded interface to some extent. In this case an average thickness of each of the base members 21 and 22 is not restricted to a specific value, but ranges preferably approximately from 0.01 to 10 mm, and more preferably approximately from 0.1 to 3 mm. Next, according to need, a bonded surface 23 of the prepared first base member 21 is subjected to surface treatment to increase adhesion with respect to the bonding film 3 to be formed on the surface 23. The treatment cleans and activates the bonded surface 23, thereby increasing the adhesion of the bonding film 3 with respect to the bonded surface 23.

The surface treatment is not specifically restricted, but may be a physical surface treatment such as sputtering or blast treatment, a plasma treatment using oxygen plasma or nitrogen plasma, a chemical surface treatment such as corona discharge, etching, electron beam radiation, UV radiation, ozone exposure, or a combination of those treatments.

Particularly, performing the surface treatment using such a plasma treatment or UV radiation treatment leads to further cleaning of the bonded surface 23 and improvement in affinity of the bonded surface 23 to the liquid coating film 30. Thereby, the adhesion between the bonded surface 23 and the bonding film 3 can be more surely improved.

Depending on the material of the first base member 21, without the above surface treatment, the adhesion between the bonded surface 23 and the bonding film 3 can be sufficiently increased. Examples of such an effective material for the base member 21 include materials mainly containing the above-described various metals and glasses.

A surface of the first base member 21 made of any of the above materials is covered with an oxide film having a hydroxyl group bound on a film surface. Accordingly, the first base member 21 formed as above has an excellent affinity to the liquid material 31, so that the bonding film 3 formed on the bonded surface 23 of the first base member 21 can be made highly adhesive without performing the surface treatment as above.

Meanwhile, similarly to the first base member 21, also a bonded surface 24 of the second base member 22 (a surface of the second member adhering closely to the bonding film 3 in a below-described step) may be subjected to a surface treatment in advance, according to need, to increase the adhesion with respect to the bonding film 3. This serves to clean the bonded surface 24 and to improve affinity of the bonded surface 24 to the bonding film 3. As a result, in the step described below, when the bonded surface 24 is adhesively bonded to the bonding film 3, adhesion between the bonded surface 24 and the bonding film 3 can be improved.

The surface treatment for the bonded surface 24 is not specifically restricted, but may be the same as that on the bonded surface 23 of the first base member 21.

In addition, similarly to the first base member 21, depending on the material for the second base member 22, the adhesion with the bonding film 3 can be sufficiently increased without the surface treatment as above. As such an effective material for the second base member 22, for example, there may be mentioned materials mainly containing the various metals or the various glasses as above.

The second base member 22 made in the above material has a surface covered with an oxide film having a hydroxyl group bound to (exposed on) a film surface. Using the second base member 22 having the surface covered with the oxide film can provide high adhesion between the bonded surface 24 of the second base member 22 and the bonding film 3 without performing the surface treatment as above.

In this case, an entire region of the second base member 22 may not necessarily be made of any one of the materials as long as at least a part of the member 22 bonded to the bonding film 3, namely a part of the bonded surface 24 is made of any one of the materials.

Alternatively, instead of the surface treatment, an intermediate layer may be formed on the bonded surface 23 of the first base member 21.

The intermediate layer can have any function, and for example, preferably, has a function of increasing the adhesion with the bonding film 3, a cushioning function (a buffer function), a function of mitigating stress concentration, or the like. As a result, forming the bonding film 3 on the intermediate layer as above, finally, allows the bonded structure 1 to be highly reliable.

Examples of a material for the intermediate layer include metals such as aluminum and titanium, oxide materials such as an metal oxide and a silicon oxide, nitride materials such as a metal nitride and a silicon nitride, carbons such as graphite and diamond carbon, and self-organizing film materials such as a silane coupling agent, a thiol compound, a metal alkoxide, and a metal-halogen compound. Among them, one kind thereof or a combination of two or more kinds thereof may be used as the material for the intermediate layer.

Among those kinds of the materials, particularly, using the oxide materials for the intermediate layer can further increase the bonding strength between the first base member 21 and the bonding film 3.

In addition, similarly to the first base member 21, on the bonded surface 24 of the second base member 22 may be formed an intermediate layer in advance, instead of performing the surface treatment.

The intermediate layer can have any function. For example, similarly to that of the first base member 21, preferably, the intermediate layer may serve to increase the adhesion with the bonding film 3, to act as a cushioning member (a buffer member), or to mitigate stress concentration. Then, bonding the second base member 22 to the bonding film 3 via the intermediate layer enables the bonded structure 1 to be finally formed as a highly reliable structure.

For example, the intermediate layer as above is made of the same material as that of the intermediate layer on the bonded surface 23 of the first base member 21.

The surface treatment and the formation of the intermediate layer as above can be performed according to need and can be omitted if any high bonding strength is not particularly needed.

Figure 3B:
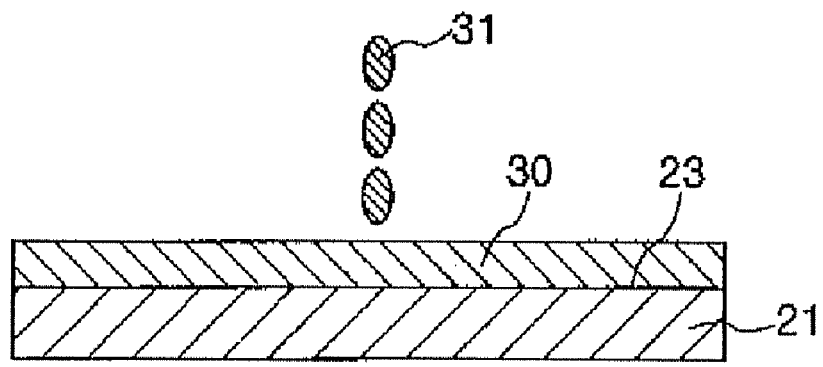

Next, at step 2, the liquid material 31 mainly containing the compound having the branched polyorganosiloxane skeleton is supplied on the bonded surface 23 by a coating method to thereby form the liquid coating film 30 on the bonded surface 23 of the first base member 21 (See FIG. 3B).

The coating method is not restricted to a specific one, but may be spin coating, casting, micro-gravure coating, gravure coating, bar coating, roll coating, wire-bar coating, dip coating, spray coating, screen printing, flexo printing, offset printing, micro contact printing, a liquid droplet discharging method, or the like. Among them, the liquid droplet discharging method is particularly preferable. Using the liquid droplet discharging method allows the liquid material 31 to be supplied as droplets on the bonded surface 23, as shown in FIG. 3B. Accordingly, even if the liquid coating film 30 is patterned selectively on a partial region of the bonded surface 23, the liquid material 31 can be supplied in accordance with a shape of the partial region (selectively on the region).

Although the liquid droplet discharging method is not restricted to a specific one, an inkjet method is preferably used to discharge the liquid material 31 by using piezoelectric-element-induced vibration. Using the inkjet method allows droplets of the liquid material 31 to be supplied with a high positional precision on an intended region (position). In addition, appropriately setting a number of vibrations of piezoelectric elements, a viscosity of the liquid material 31, and the like allows a droplet size to be relatively easily adjusted. Thus, allowing the droplet size to be small can ensure formation of the liquid coating film 30 in accordance with the shape of a region for the bonding film 3 even if the film-formed region has a minute shape.

The liquid material 31 usually has a viscosity (at 25° C.) ranging preferably approximately from 0.5 to 200 mPa·s, and more preferably approximately 3 to 20 mPa·s. Setting the viscosity of the liquid material 31 in the range allows the droplets to be discharged more stably. In addition, the droplets can be discharged with a size enough to draw a shape in accordance with the film-formed region having the minute shape. Furthermore, when drying the liquid coating film 30 made of the liquid material 31 at step 3 as below, the liquid material 31 can contain the branched compound having an amount enough to form the bonding film 3. In short, the branched compound is surely preferable to form the bonding film 3 using the inkjet method.

When the liquid material 31 has the viscosity set in the above range, specifically, an amount of each of the droplets (the amount of a single droplet of the liquid material 31) can be set, on an average, in a range of approximately 0.1 to 40 pL, and more practically in a range of approximately 1 to 30 pL. This allows a landing diameter of a droplet supplied on the bonded surface 23 to be small, whereby the bonding film 3 having the minute shape can be surely formed.

Furthermore, in the method for forming the bonding film 3 using the inkjet method, appropriately setting the amount of droplets supplied on the bonded surface 23 enables the thickness of the formed bonding film 3 to be controlled relatively easily.

The liquid material 31 is prepared by dissolving the compound having the branched polyorganosiloxane skeleton as described above in a solvent.

The solvent for dissolving the compound having the branched polyorganosiloxane skeleton is not particularly restricted. Examples of the solvent include inorganic solvents such as ammonia, water, hydrogen peroxide, carbon tetrachloride, and ethylene carbonate, ketone solvents such as methyl ethyl ketone (MEK) and acetone, alcoholic solvents such as methanol, ethanol, and isobutanol, ether solvents such as diethyl ether and diisopropyl ether, cellosolve solvents such as methyl cellosolve, aliphatic hydrocarbon solvents such as hexane and pentane, aromatic hydrocarbon solvents such as toluene, xylene, ethyl benzene, and benzene, aromatic heterocyclic solvents such as pyridine, pyrazine, and furan, amido solvents such as N,N-dimethylformamide (DMF), halogen solvents such as dichloromethane and chloroform, ester solvents such as ethyl acetate and methyl acetate, sulfuric solvents such as sulfolane, nitrile solvents such as acetonitrile, propionitrile, and acrylonitrile, various organic solvents such as organic acid solvents including formic acid and trifluoroacetic acid, and mixtures of the solvents mentioned above.

Among the solvents, preferably, solvents having a vapor pressure of approximately 10 to 800 Torr at 40° C., such as pentane, diethyl ether, methanol, ethanol, toluene, water, isobutanol, ethyl benzene, and xylene, and particularly, solvents having a vapor pressure of approximately 10 to 300 Torr at 40° C., such as methanol, ethanol, toluene, and water are used alone or in combination of two or more thereof. Thereby, at step 3 below, when drying the liquid coating film 30 at a temperature not exceeding 40° C., the solvent can be immediately and surely removed from the liquid coating film 30 even if the coating film is not exposed to reduced atmospheric pressure. Consequently, the bonding film 3 can be immediately and surely formed on the first base member 21.

The compound having the branched polyorganosiloxane skeleton is the main material of the bonding film 3 included in the bonded structure 1. The compound is contained in the liquid material 31 in a dissolved state. The liquid material 31 is dried at step 3 below to form the bonding film 3.

When drying the liquid coating film 30 at step 3 below, molecules in the branched compound are entangled with each other to form a three-dimensional network structure, thereby forming the bonding film 3. Thus, the formed bonding film 3 has high strength.

When the branched compound includes a silanol group, namely a hydroxyl group as the each group Z and the first base member 21 includes a hydroxyl group exposed on the bonded surface (a main surface) 23, the hydroxyl groups of the branched compound and the first base member 21 are bound with each other. Thereby, the branched compound can be bound with the first base member 21 both physically and chemically. As a result, the bonding film 3 is strongly bonded to the bonded surface 23 of the first base member 21.

In addition, the branched compound is a relatively flexible material. Thus, at step 4 following step 3, when obtaining the bonded structure 1 by bonding the first base member 21 to the second base member 22 via the bonding film 3, stress due to thermal expansion between the base members 21 and 22 can be surely mitigated even if the base members 21 and 22 are made of a different material, for example. Thereby, prevention of separation can be ensured in the bonded structure 1 finally obtained.

Figure 3C:
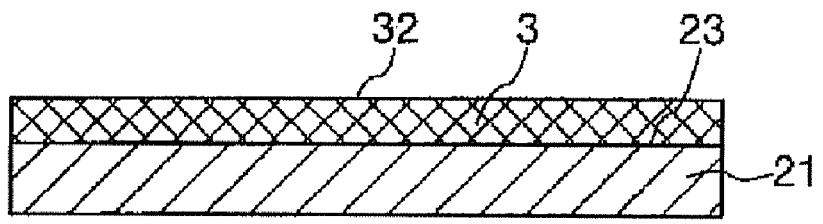

Next, at step 3, the liquid coating film 30 formed on the first base member 21 is dried to form the bonding film 3 (See FIG. 3C).

A temperature for drying the liquid coating film 30 is set not to exceed 40° C., and is preferably set in a range of approximately 20 to 35° C.

Drying the liquid coating film 30 under the above temperature condition can ensure formation of the bonding film 3 while maintaining properties of the compound having the branched polyorganosiloxane skeleton included in the film 30, without causing degeneration, deterioration, or the like in the branched compound. As a result, it is ensured that there can be formed the bonding film 3 expressing suitable adhesiveness when a compressive force is applied to the first and the second base members 21 and 22 at step 4 below. Additionally, in the branched compound including silanol groups, binding between the silanol groups can be ensured.

Furthermore, the bonding film 3 is formed while maintaining the properties of the branched compound. In the bonded structure 1 including the bonding film 3 thus formed, when the disassembling method of the embodiment is applied, the bonding film 3 is more surely molten when heated at a temperature equal to or higher than the glass transition point of the branched compound.

A time for drying the liquid coating film 30 is preferably approximately 0.5 to 48 hours, and more preferably approximately 15 to 30 hours.

An ambient pressure in the drying process may be an atmospheric pressure, but preferably a reduced pressure. Specifically, a range of the reduced pressure is preferably approximately from $133.3 \times 10^{-5}$ to 1333 Pa ($1 \times 10^{-5}$ to 10 Torr), and more preferably approximately $133.3 \times 10^{-4}$ to 133.3 Pa ($1 \times 10^{-4}$ to 1 Torr). Thereby, the solvent included in the liquid coating film 30 can be immediately and surely removed, whereby a film density of the formed bonding film 3 becomes elaborate. Thus, the bonding film 3 can have higher film strength. When the solvent used for preparing the liquid material 31 has the vapor pressure of approximately 10 to 800 Torr at 40° C., the solvent in the liquid coating film 30 can be immediately and surely removed even under the atmospheric pressure. Accordingly, there can be obtained the same advantages as those obtained under the reduced pressure.

When drying the liquid coating film 30, for example, while allowing the bonded surface 23 having the film 30 to face upward, the first base member 21 may be rotated around a thickness direction of the first base member 21 as a rotation axis. Thereby, the liquid coating film 30 can be more immediately dried. In addition, appropriately setting a number of rotations of the first base member 21 enables an extra amount of the liquid material 31 supplied on the first base member 21 to be flown away from an edge of the base member. This can facilitate control of a thickness of the liquid coating film 30 formed.

The number of rotations of the first base member 21 ranges preferably approximately from 500 to 5,000 rpm, and more preferably approximately from 1,000 to 3,000 upm. Setting the number of the rotations thereof in the range allows drying of the liquid coating film 30 to be accomplished along with the control of the thickness of the film 30.

An average thickness of the bonding film 3 ranges preferably approximately from 10 to 10,000 and more preferably approximately from 50 to 5,000. Setting the average thickness of the bonding film 3 in the range by appropriately determining the amount of the supplied liquid material 31 can prevent a significant reduction in a size precision of the structure obtained by bonding the first and the second base members 21 and 22, as well as can ensure stronger bonding of the members.

If the average thickness of the bonding film 3 is below the lower limit value, bonding strength cannot be sufficient. Meanwhile, in the bonding film 3 having an average thickness larger than the upper limit value, the size precision of the bonded structure can significantly be reduced.

However, in the disassembling method of the embodiment described above, the bonding film 3 having an average thickness set in the range can be immediately molten. Thus, separation between the first and the second base members 21 and 22 can be achieved without causing degeneration or deterioration in both base members.

Furthermore, setting the average thickness of the bonding film 3 in the range allows the film 3 to be elastic to some extent. Thereby, at step 4 below, when bonding the two base members 21 and 22 together, even if any particle or the like is present on the bonded surface 24 of the second base member 22 contacted with the bonding film 3, the bonding film 3 is bonded to the bonded surface 24 in such a manner that the particle or the like is surrounded by the bonding film 3. This can appropriately suppress or prevent reduction in the bonding strength on an interface between the bonding film 3 and the bonded surface 24 and separation occurring on the interface due to the presence of the particle or the like.

In the embodiment, the bonding film 3 is formed by supplying the liquid material 31 on the bonded surface 23. Accordingly, even if an uneven spot exists on the bonded surface 23 of the first base member 21, the bonding film 3 is formed in accordance with a shape of the uneven spot depending on a height of the uneven spot. Thereby, the bonding film 3 covers the uneven spot, thus enabling a surface of the film to be almost flattened.

Figure 4D:
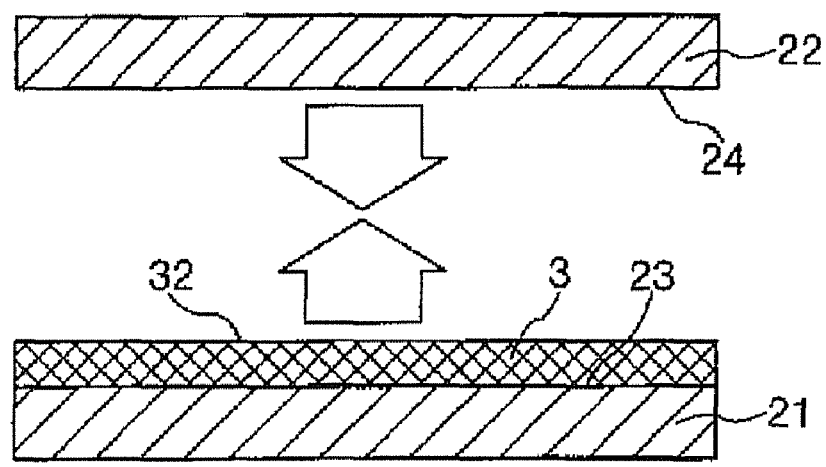
FIGS. 4D to 4F are also diagrams (longitudinal sectional views) illustrating the first configuration of the bonded-structure forming method shown in FIG. 1.

Next, at step 4, the first base member 21 is contacted with the second base member 22 (See FIG. 4E) in a condition where the bonding film 3 on the first base member 21 is interposed between the first and the second base members 21 and 22 (See FIG. 4D). In this condition, a compressive force is applied to both the first and the second base members 21 and 22 (See FIG. 4F). Then, the liquid coating film 30 is dried at a temperature not exceeding 40° C. to form the bonding film 3. Thus, the bonding film 3 adheres to the bonded surface 24 of the second base member 22, thereby completing the bonded structure 1 including the first and the second base members bonded to each other via the bonding film 3.

In the above process, bonding of the bonding film 3 to the bonded surface 24 seems to occur due to a mechanism as follows.

With the compressive force applied to the bonding film 3 through the base members, first, the surface of the bonding film 3 approaches the bonded surface 24. In this situation, when a further compressive force (energy) is applied to the bonding film 3, a hardness of the bonding film 3 is reduced, whereby the bonding film 3 is embedded in the bonded surface 24 to be physically bonded to the second base member 22. Other than the physical bonding, a chemical bonding such as hydrogen bonding seems to occur between the compound having the branched polyorganosiloxane skeleton and the second base member 22 due to the approach of the surface of the bonding film 3 to the bonded surface 24.

Therefore, in the bonded structure 1, the first and the second base members 21 and 22 seem to be bonded together via the bonding film 3 not only by adhesion based on the physical bonding such as mainly anchor effect, like adhesives used in conventional bonding methods, but by adhesion based on the chemical bonding such as hydrogen bonding. Accordingly, the bonded structure 1 can be formed in a short time, and separation between the base members and bonding unevenness cannot obviously occur.

Figure 4E:
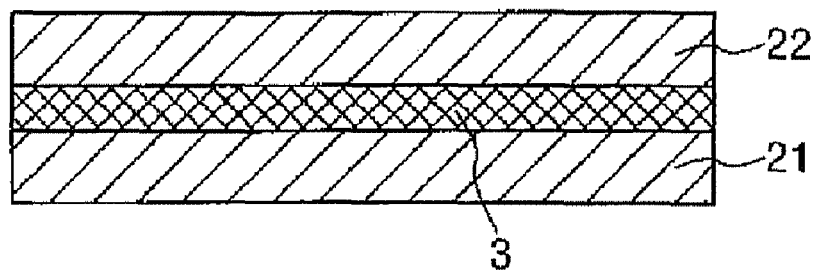
Figure 4F:
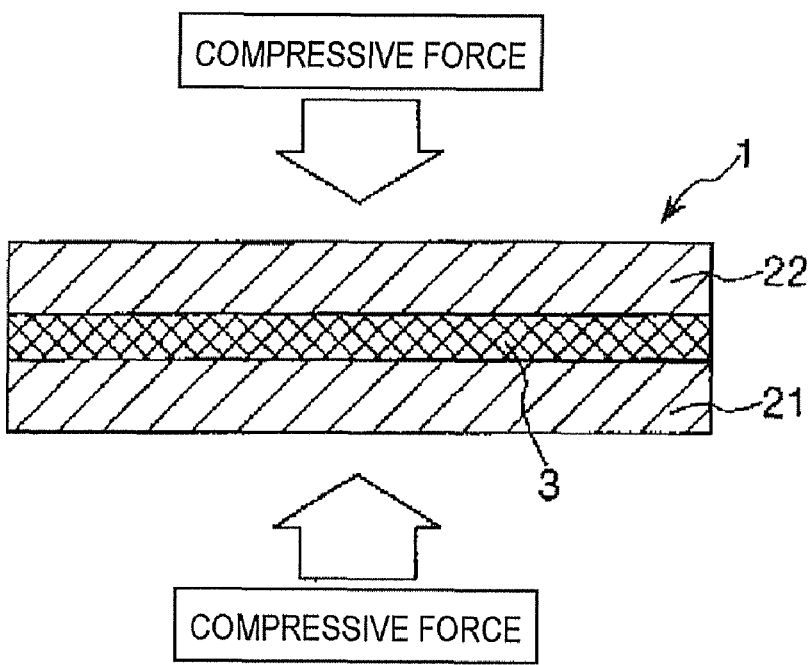

In the bonding method described above, in the condition where the first and the second base members 21 and 22 are not in contact with each other, namely in the condition of FIG. 4E, the base members are not bonded to each other yet. This can adjust a relative position of the first base member 21 with respect to the second base member 22. Thereby, after superimposing the base members 21 and 22 together, the positions of the base members can be easily finely adjusted. As a result, the first and the second base members 21 and 22 can be bonded together with higher positional precision.

In addition, the temperature for heating the bonding film 3 can be set equal to or lower than 200° C. when obtaining the bonded structure 1 by the bonded-structure forming method as above. In other words, the bonding film 3 can be heated at such a low temperature when obtaining the bonded structure 1 including the first and the second base members 21 and 22 bonded to each other via the bonding film 3 mainly made of the compound having the branched polyorganosiloxane skeleton. Thus, unlike solid bonding, thermal processing at high temperature (e.g. 700° C. or higher) is unnecessary, so that the first and the second base members 21 and 22 made of a material with low thermal resistance can be bonded together.

In the case of solid bonding, no bonding film is interposed between the base members. Thus, when there is a significant difference in thermal expansion ratio between the first and the second base members 21 and 22, stress due to the difference tends to be concentrated on a bonding interface between the members, thus causing separation therebetween or the like. However, in the bonded structure 1 of the embodiment, the stress concentration is mitigated by the presence of the bonding film 3, thereby appropriately suppressing or preventing such separation.

In the bonded structure 1 thus obtained, a bonding strength between the first and the second base members 21 and 22 is preferably equal to or higher than 5 MPa (60 kgf/cm$^2$), and more preferably equal to or higher than 10 MPa (100 kgf/cm$^2$). The bonded structure 1 having a bonding strength value in the above ranges can sufficiently prevent the separation between the base members. Accordingly, as will be described later below, for example, when forming a liquid droplet discharging head by using the bonded structure 1, the discharging head formed has an excellent durability.

The compressive force applied to the first and the second base members 21 and 22 is preferably as large as possible in a range of pressure where the formed bonded structure 1, namely, the base members 21, 22 and the bonding film 3 are not damaged. This can increase the bonding strength between the members in the bonded structure 1 in accordance with a magnitude of the compressive force, when other conditions such as the temperature for heating the bonding film 3 are fixed.

The magnitude of the compressive force is appropriately determined in accordance with the material and the thickness of each of the base members, the time for applying the compressive force, the temperature for heating the bonding film 3, and the like. Specifically, the magnitude of the compressive force is preferably approximately from 0.2 to 10 MPa and more preferably approximately from 1 to 5 MPa. Applying the compressive force in the range can ensure bonding of the bonding film 3 to the bonded surface 24. The compressive force may exceed the upper limit value. In this case, the first and the second base members 21 and 22 may be damaged or the like depending on the materials of the base members.

The time for applying the compressive force is appropriately determined in accordance with the magnitude of the compressive force applied, the temperature for heating the bonding film 3, and the like. For example, even when the time for applying the compressive force is reduced as the compressive force applied to the first and the second base members 21 and 22 increases, the bonding film 3 can be bonded to the bonded surface 24. Accordingly, the compressive-force applying time can be set short. Specifically, the applying time is preferably approximately from 5 to 180 minutes, and more preferably approximately from 10 to 80 minutes. Setting the time for applying the compressive force in the range enables the bonding film 3 to be surely bonded to the bonded surface 24.

Upon application of the compressive force, preferably, the bonding film 3 is heated. Thereby, heat energy is applied to the bonding film 3, thereby further facilitating the bonding of the bonding film 3 to the bonded surface 24 by the compressive force applied to the film.

The temperature for heating the bonding film 3 is not specifically restricted as long as the temperature is higher than room temperature and lower than an upper temperature limit of each of the first and the second base members 21 and 22. The heating temperature ranges preferably approximately from 40 to 200° C., and more preferably approximately from 100 to 150° C. Heating the bonding film 3 at a temperature in the range can surely prevent degeneration and deterioration of the first and the second base members 21, 22 due to heat, as well as can ensure that the bonding film 3 is more smoothly bonded to the bonded surface 24, thereby ensuring increase in the bonding strength. That is, with application of the compressive force, the bonding of the bonding film 3 to the bonded surface 24 can be further promoted, so that the bonding strength between the bonding film 3 and the bonded surface 24 can be surely increased.

The application of the compressive force to the base members 21, 22 may be performed in any atmosphere, such as an air atmosphere, an oxidizing gas atmosphere such as oxygen atmosphere, a reducing gas atmosphere such as hydrogen atmosphere, an inert gas atmosphere such as nitrogen or argon atmosphere, a reduced pressure (vacuum) atmosphere reducing pressure in those atmospheres, or the like. Among them, particularly, the air atmosphere is preferable. Thereby, without any time and cost for atmosphere control, the compressive force can be more easily applied.

Through the steps described above, the bonded structure 1 including the bonding film 3 is formed. Accordingly, when the bonding film 3 is heated at a temperature equal to or higher than the glass transition point of the branched compound by using the disassembling method of the embodiment, the film 3 can be more surely molten.

The embodiment has described the bonding method using the inkjet method as an example of the liquid droplet discharging method. Instead of the inkjet method, the discharging method may be a bubble jet method ("bubble jet" is a registered trademark) that discharges ink by thermal expansion of a material caused by an electrothermal converting element. The bubble jet method can also provide the same advantageous effects as those described above.

Second Configuration

Next will be described the second configuration of the bonded-structure forming method.

FIG. 5 is a longitudinal sectional view for illustrating the second configuration of the bonded-structure forming method. In the description below, upper and lower sides, respectively, in the drawing are referred to as "upper and lower", respectively.

Hereinafter, in the description of the second configuration of the method, there will be discussed points different from those described in the first configuration of the method, and descriptions of the same points will be omitted.

In the second configuration of the bonded-structure forming method, on the bonded surface (main surface) 23 is formed the bonding film 3 by using the liquid material 31, as well as on the bonded surface (main surface) 24 of the second base member 22 is formed the bonding film 3 by using the liquid material 31. Then, in a condition where the bonding films 3 of the base members 21 and 23 are contacted with each other, a compressive force is applied to integrate the bonding films 3 so as to obtain the bonded structure 1 including the first and the second base members 21 and 22 bonded together via the bonding films 3. Other points than those above are the same as in the first configuration.

That is, in the bonded-structure forming method using the second configuration, the bonding film 3 is formed by the liquid material 31 on both the first and the second base members 21 and 22. Then, the bonding films 3 of the base members are integrated with each other, and thereby, the first and the second base members 21 and 22 are bonded with each other via the bonding films 3 to obtain the bonded structure 1.

First, the first and the second base members 21 and 22 similar to those in step 1 above are prepared.

Next, in the same manner as described in steps 2 and 3, the bonding film 3 is formed on both the bonded surfaces 23 and 24, respectively, of the first and the second base members 21 and 22, respectively.

Figure 5A:
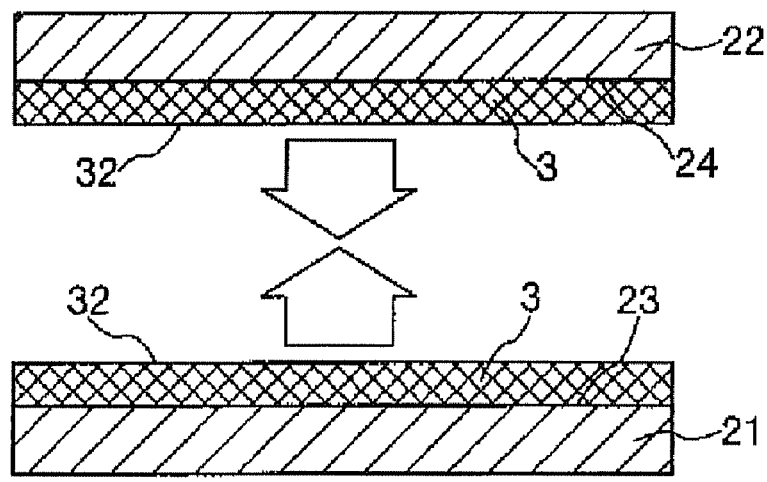
FIGS. 5A to 5C are diagrams (longitudinal sectional views) illustrating a second configuration of the bonded-structure forming method shown in FIG. 1.
Figure 5B:
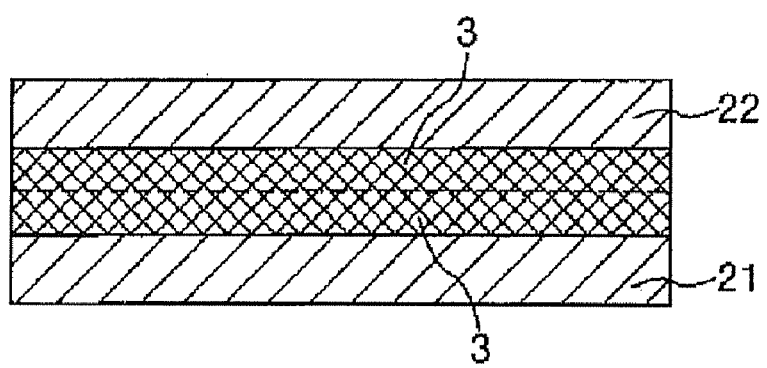
Figure 5C:
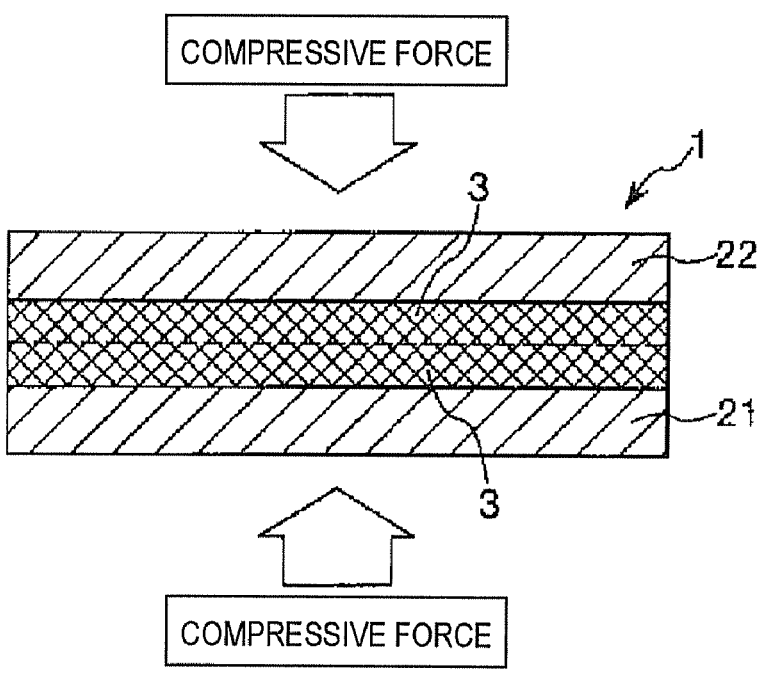

Then, the first and the second base members 21 and 22 are contacted with each other (See FIG. 5B) such that the bonding films 3 of both base members face each other (See FIG. 5A). In this condition, the compressive force is applied to both the first and the second base members 21 and 22 (See FIG. 5C). Thereby, the bonding films 3 formed on the base members 21 and 22 are integrated with each other, resulting in formation of the bonded structure 1 including the base members 21 and 22 bonded to each other via the bonding films 3.

In the second configuration, the first and the second base members 21 and 22 are bonded to each other by integrating together the bonding films 3 on the base members 21 and 22. In this situation, a chemical bonding such as hydrogen bonding seems to be occurring between the branched compounds included in the bonding films 3 such that the branched compounds seem to be entangled with each other. Thus, the first and the second base members 21 and 22 can be more strongly bonded to each other.

In addition, since the base members 21 and 22 are bonded together via the bonding films 3 formed on both base members, there is an advantage that the material for each base member is not restricted. This can increase options of the material for each base member.

Conditions for bonding the base members 21 and 22 to each other are the same as those described in step 4 above.

In the manner described hereinabove, the bonded structure 1 can be obtained.

Liquid Droplet Discharging Head

Next, a description will be given of an inkjet recording head according to an embodiment of the invention formed by applying the bonded structure disassembled by the disassembling method of the embodiment described above.

Figure 6:
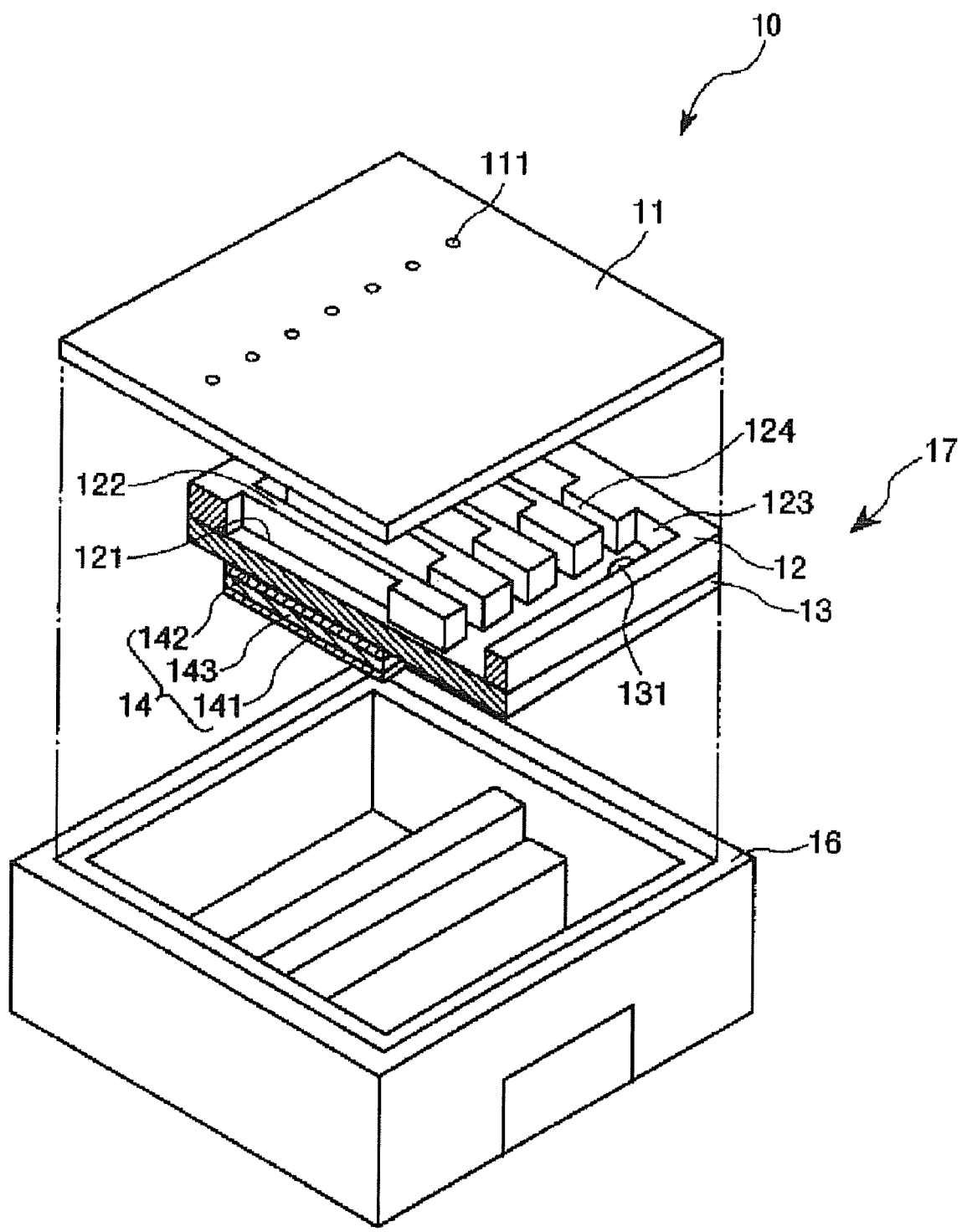
FIG. 6 is a perspective view showing an inkjet recording head (a liquid droplet discharging head) obtained by applying the bonded structure used in FIG. 1.
Figure 7:
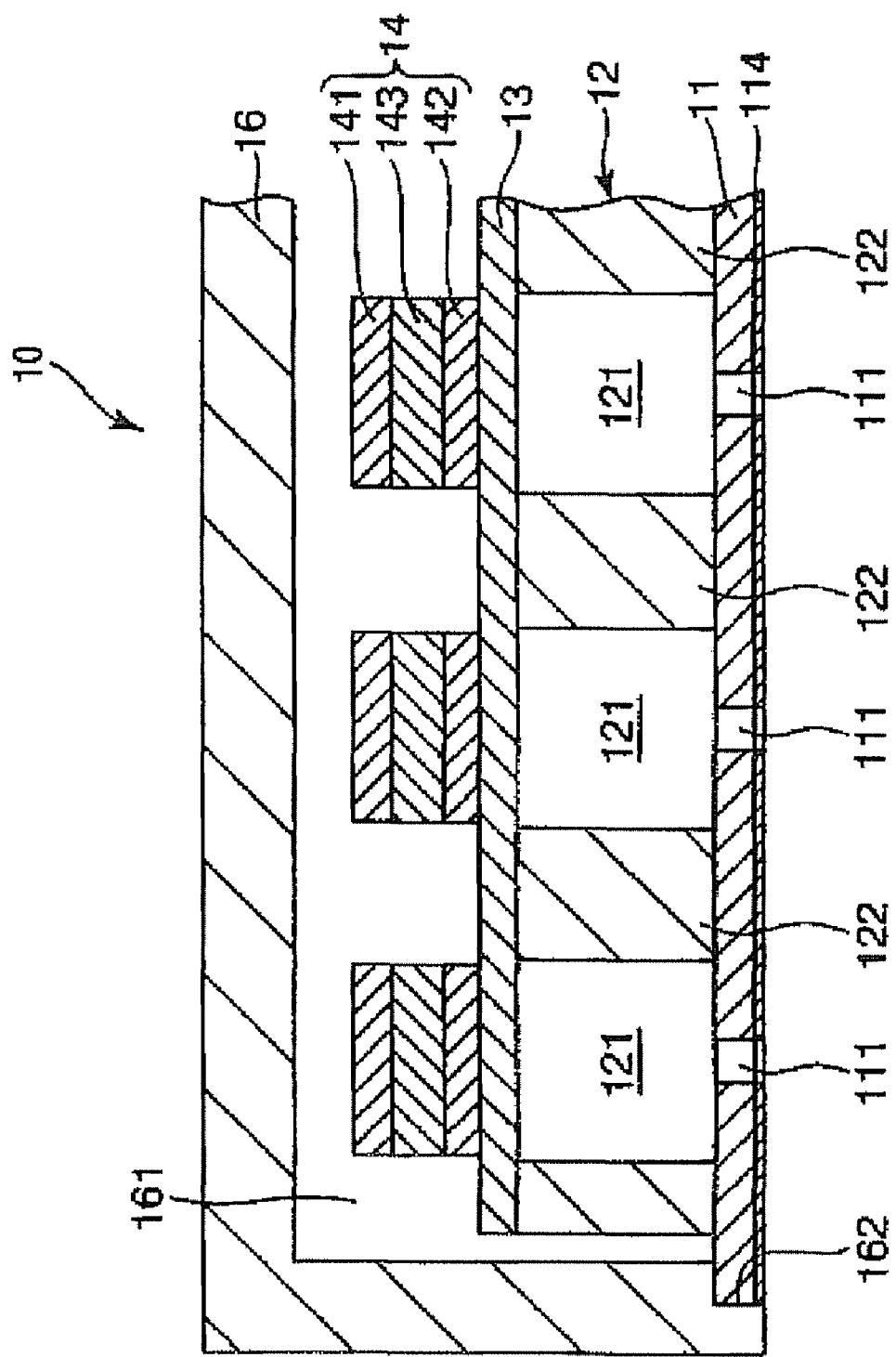
FIG. 7 is a sectional view showing a structure of a main part of the inkjet recording head shown in FIG. 6.
Figure 8:
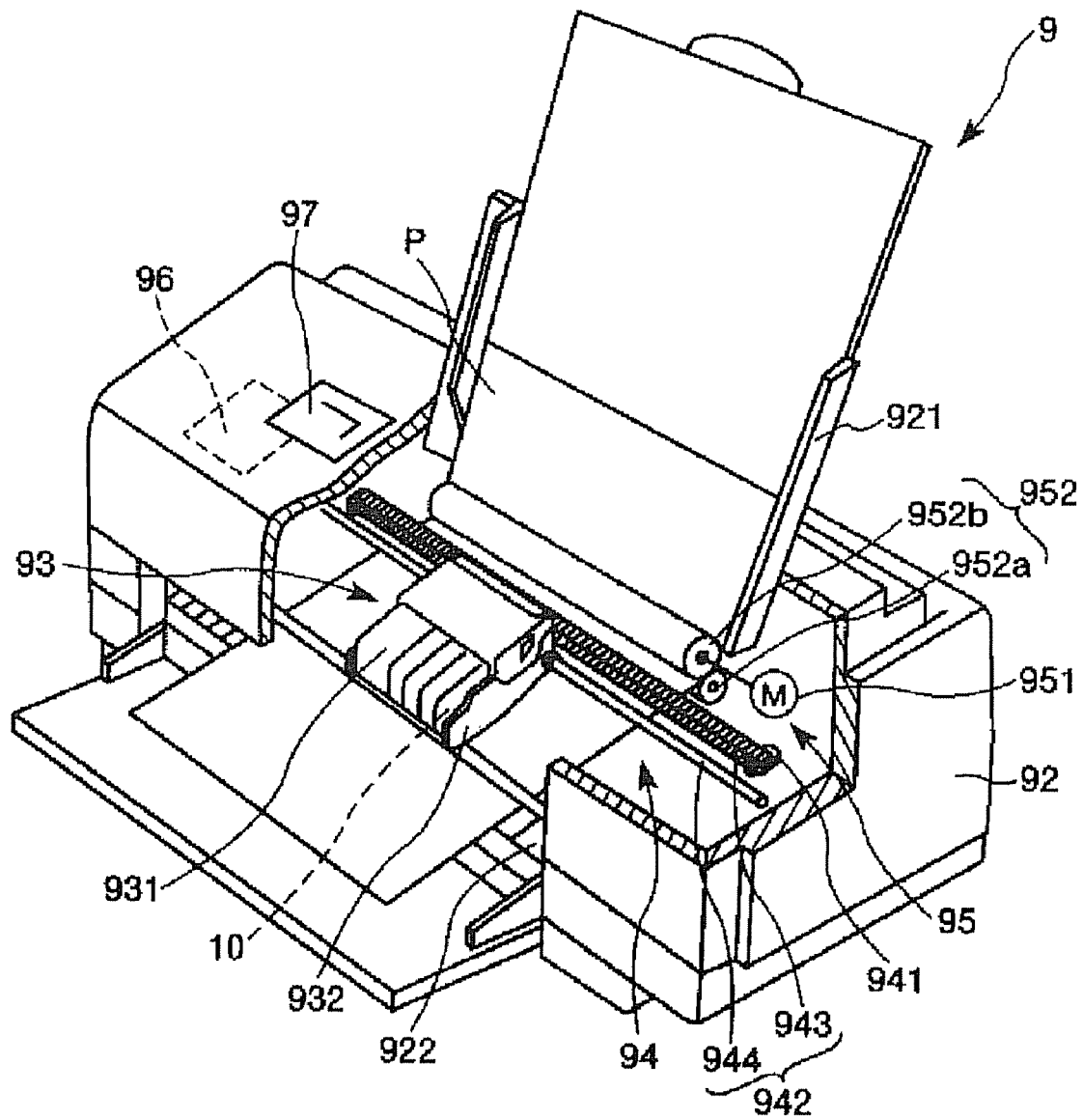
FIG. 8 is a schematic view showing an inkjet printer according to an embodiment including the inkjet recording head shown in FIG. 6.

FIG. 6 is an exploded perspective view showing the inkjet recording head (a liquid droplet discharging head); FIG. 7 is a sectional view showing a structure of a main part of the inkjet recording head shown in FIG. 6; and FIG. 8 is a schematic diagram showing an inkjet printer according to an embodiment of the invention including the inkjet recording head shown in FIG. 6. In the drawing, the head is shown upside down relative to its normal operative position.

An inkjet recording head 10 shown in FIG. 6 is mounted in an inkjet printer 9 as shown in FIG. 8.

The inkjet printer 9 in FIG. 8 includes a main body 92. At a rear part of an upper region of the main body 92 is provided a tray 921 for setting a record paper P; at a lower part of a front region thereof is provided a paper ejection outlet 922 ejecting the record paper P; and on a top surface thereof is provided an operation panel 97.

For example, the operation panel 97 is formed by a liquid crystal display, an organic EL display, an LED lamp, or the like, and includes a display section (not shown) displaying an error message and the like and an operating section (not shown) formed by various kinds of switches and the like.

Inside the main body 92 are mainly provided a printing device (a printing unit) 94 with a reciprocating head unit 93, a paper feeding device (a paper feeding unit) 95 feeding each sheet of the record paper P into the printing device 94, and a controlling section (a controlling unit) 96 controlling the printing device 94 and the paper feeding device 95.

The controlling section 96 controls the paper feeding device 95 to intermittently feed each sheet of the record paper P. The record paper P passes through near a lower part of the head unit 93. During the passing of the record paper P, the head unit 93 reciprocates in a direction approximately orthogonal to a direction for feeding the record paper P to perform printing on the record paper P. In short, reciprocation of the head unit 93 and the intermittent feeding of the record paper P, respectively, correspond to main scanning and sub-scanning, respectively, in the printing operation so as to perform inkjet printing.

The printing device 94 includes the head unit 93, a carriage motor 941 as a driving source for the head unit 93, and a reciprocation mechanism 942 allowing the head unit 93 to reciprocate.

At the lower part of the head unit 93 are provided an inkjet recording head 10 (hereinafter simply referred to as "head 10") with a plurality of nozzle holes 111, an ink cartridge 931 supplying ink to the head 10, and a carriage 932 having the head 10 and the ink cartridge 931 mounted thereon.

The ink cartridge 931 includes four color (yellow, cyan, magenta, and black) ink cartridges to perform full-color printing.

The reciprocation mechanism 942 includes a carriage guiding shaft 943 having end portions supported by a frame (not shown) and a timing belt 944 extended in parallel to the carriage guiding shaft 943.

The carriage 932 is reciprocatably supported by the carriage guiding shaft 943 and fixed to a part of the timing belt 944.

With operation of the carriage motor 941, the timing belt 944 runs forward and backward via pulleys, whereby the head unit 93 is guided by the carriage guiding shaft 943 to perform reciprocating motion. During the reciprocation, the head 10 discharges ink according to need to perform printing on the record paper P.

The paper feeding device 95 includes a paper feeding motor 951 and paper feeding rollers 952 rotated by operation of the paper feeding motor 951.

The paper feeding rollers 952 include a driven roller 952a and a driving roller 952b that are opposing each other at upper and lower positions while sandwiching a feed channel of the record paper P. The driving roller 952b is coupled to the paper feeding motor 951. Thereby, the paper feeding rollers 952 are configured so as to feed each of multiple sheets of the record paper P set in the tray 921 to the printing device 94. Instead of the tray 921, there may be removably provided a paper feeding cassette containing the record paper P.

The controlling section 96 controls the printing device 94, the paper feeding device 95, and the like based on print data input from a personal computer, a host computer of a digital camera or the like.

The controlling section 96 mainly includes a memory storing control programs controlling respective sections and the like, a piezoelectric element driving circuit driving piezoelectric elements 14 (a vibration source) to control timing of discharging of the ink, a driving circuit driving the printing device 94 (the carriage motor 941), a driving circuit driving the paper feeding device 95 (the paper feeding motor 951), a communication circuit acquiring the print data from the host computer, and a CPU electrically connected to those components to perform various kinds of controls at the respective sections, although the components are not shown in the drawing.

In addition, for example, the CPU is electrically connected to various kinds of sensors detecting an amount of ink left in each of the ink cartridges 931, a position of the head unit 93, and the like.

The controlling section 96 acquires the print data to store the data in the memory via the communication circuit. The CPU processes the print data to output a driving signal to each driving circuit based on the processed data and input data from the sensors. Outputting the driving signal allows the piezoelectric elements 14, the printing device 94, and the paper feeding device 95 to operate, whereby printing is performed on the record paper P.

Hereinafter, the head 10 will be described in detail with reference to FIGS. 6 and 7.

The head 10 includes a head main body 17 including a nozzle plate 11, an ink cavity substrate 12, a vibrating plate 13, and the piezoelectric elements 14 (the vibration source) bonded to the vibrating plate 13 and a base body 16 storing the head main body 17. The head 10 forms an on-demand piezo jet head.

The nozzle plate may be made of a silicon material such as $SiO_2$, SiN, or quartz glass, a metal material such as Al, Fe, Ni, Cu, or an alloy thereof, an oxide material such as alumina or ion oxide, a carbon material such as carbon black or graphite, or the like.

In the nozzle plate 11 are formed the multiple nozzle holes 111 for discharging droplets of the ink. Pitches between the nozzle holes 111 are appropriately determined in accordance with printing precision.

The ink cavity substrate 12 is adhered (fixed) to the nozzle plate 11.

The ink cavity substrate 12 includes a plurality of ink cavities (namely, pressure cavities) 121, a reservoir 123 storing ink supplied from each ink cartridge 931, and a supply hole 124 supplying the ink to each ink cavity 121. The ink cavities 121, the reservoir 123, and the supply holes 124 are partitioned by the nozzle plate 11, side walls (partition walls) 122, and the vibrating plate 13 described below.

Each ink cavity 121 is formed in a strip shape (a rectangular shape) and arranged corresponding to each nozzle hole 111. A capacity of the each ink cavity 121 can be changed by vibration of the vibrating plate 13 described below. The ink cavity 121 is configured such that ink is discharged by changing of the capacity.

For example, a base material for the ink cavity substrate 12 is a silicon monocrystalline substrate, a glass substrate, a resin substrate, or the like. Those substrates are all for general purpose use. Accordingly, using any one of the substrates can reduce production cost of the head 10.

The vibrating plate 13 is bonded to a side of the ink cavity substrate 12 not facing the nozzle plate 11, and the piezoelectric elements 14 are provided on a side of the vibrating plate 13 not facing the ink cavity substrate 12.

At a predetermined position of the vibrating plate 13 is formed a through-hole 131 penetrating through in a thickness direction of the vibrating plate 13. Ink can be supplied to the reservoir 123 from each ink cartridge 931 via the through-hole 131.

Each of the piezoelectric elements 14 is formed by interposing a piezoelectric layer 143 between a lower electrode 142 and an upper electrode 141 and arranged corresponding to an approximately center part of each ink cavity 121. The each piezoelectric element 14 is electrically connected to the piezoelectric-element driving circuit to operate (vibrate and deform) in response to a signal from the piezoelectric-element driving circuit.

The piezoelectric element 14 serves as each vibration source. Vibration of the piezoelectric elements 14 allows the vibrating plate 13 to vibrate so as to momentarily increase an internal pressure in the ink cavities 121.

The base body 16 may be made of any one of resin materials metal materials, and the like. The nozzle plate 11 is fixed to the base body 16 to be supported by the base body 16. Specifically, An edge region of the nozzle plate 11 is supported by a stepped portion 162 formed at an outer periphery of a recessed portion 161 of the base body 16 in a condition where the recessed portion 161 stores the head main body 17.

Among the bonding between the nozzle plate 11 and the ink cavity substrate 12, the bonding between the ink cavity substrate 12 and the vibrating plate 13, and the bonding between the nozzle plate 11 and the base body 16, at least one bonding is performed using the bonded-structure forming method described above.

In other words, the above-described bonded structure is applied to at least one of a bonded structure of the nozzle plate 11 and the ink cavity substrate 12, a bonded structure of the ink cavity substrate 12 and the vibrating plate 13, and a bonded structure of the nozzle plate 11 and the base body 16.

The head 10 thus configured is bonded to the bonding film 3, as described above, interposed on the bonding interface. This increases bonding strength and chemical resistance of the bonding interface, thereby improving durability and liquid tightness against ink stored in each ink cavity 121. Consequently, the head 10 has high reliability.

In addition, since a highly reliable bonding can be provided at a very low temperature, it is advantageous to obtain a large head even when using a material having a different linear expansion coefficient.

Using the described-above bonded structure as a part of the head 10 allows the head 10 to be constructed with high size precision. Thus, a high level of control can be achieved over the direction of ink discharged from the head 10 and a clearance between the head 10 and the record paper P, thereby improving quality of a print result obtained by the inkjet printer 9.

In order to recycle (disassemble) the head 10 thus configured, using the disassembling method of the embodiment allows at least one of the bonded structures mentioned above applying the bonded structure of the embodiment to be surely disassembled. Thus, at least one of the bonded structures can be disassembled to obtain at least one of a disassembled structure of the nozzle plate 11 and the ink cavity substrate 12, a disassembled structure of the ink cavity substrate 12 and the vibrating plate 13, and a disassembled structure of the nozzle plate 11 and the base body 16. Thereby, each of the members disassembled can be recycled, thus ensuring improvement in a recycling rate.

In the head 10 thus configured, the each piezoelectric layer 143 is not deformed in a condition where a predetermined discharging signal is not input via the piezoelectric-element driving circuit, namely in a condition where no voltage is applied between the lower and the upper electrodes 142 and 141. Accordingly, the vibrating plate 13 is also not deformed, thus causing no change in the capacity of the ink cavity 121. As a result, no ink droplet is discharged from the nozzle hole 111.

Meanwhile, the piezoelectric layer 143 is deformed when a predetermined signal is input via the piezoelectric-element driving circuit, namely when a predetermined voltage is applied between the electrodes 142 and 141 of the piezoelectric element 14. Thereby, the vibration plate 13 is largely bent, and thus, the capacity of the ink cavity 121 changes. Then, pressure inside the ink cavity 121 momentarily increases, resulting in discharging of an ink droplet form the nozzle hole 111.

After discharging ink one time, the piezoelectric-element driving circuit stops application of a voltage between the lower and the upper electrodes 142 and 141. Thereby, the piezoelectric element 14 returns to an approximately original shape and the capacity of the ink cavity 121 increases. In this situation, ink is under pressure directing toward the nozzle hole 111 from the ink cartridge 931 (pressure in a forward direction). This prevents air from entering from the nozzle hole 111 into the ink cavity 121, so that ink having an amount corresponding to an amount of ink to be discharged is supplied to the ink cavity 121 from the ink cartridge 931 (the reservoir 123).

In this manner, in the head 10, a discharging signal is sequentially input to the piezoelectric element 14 at a position necessary for printing via the piezoelectric-element driving circuit, thereby enabling arbitrary (desired) characters, figures, and the like to be printed.

Additionally, the head 10 may include an electrothermal converting element instead of the piezoelectric element 14. That is, the head 10 may be of the bubble jet ("bubble jet" is a registered trademark) system using thermal expansion of a material by the electrothermal converting element.

In the head 10 structured as above, on the nozzle plate 11 is formed a coating film 114 exhibiting lyophobic properties. This can surely prevent a droplet of ink from being left around the nozzle hole 111 when the droplet is discharged from the nozzle hole 111. As a result, the ink droplet from the nozzle hole 111 can be surely landed on an intended region.

Furthermore, obviously, the bonded structure of the embodiment is applicable to various components, devices, and the like, other than the liquid droplet discharging head described in the embodiment. Specific examples of such items include semiconductor elements such as transistors, diodes, and memories, piezoelectric elements such as quartz oscillators, optical elements such as reflective mirrors, optical lenses, diffraction gratings, and optical filters, photoelectric converting elements such as solar cells, components for the micro electro mechanical systems (MEMS) such as semiconductor substrates with semiconductor elements mounted thereon, insulating substrates with wirings or electrodes, inkjet recording heads, micro reactors, and micro mirrors, sensor components such as pressure sensors and acceleration sensors, packaging components of semiconductor elements and electronic components, storage media such as magnetic storage media, optical magnetic storage media, and optical storage media, display components such as liquid crystal display elements, organic EL elements, and electrophoretic display elements, and fuel cell components.

Hereinabove, the bonded-structure disassembling method of the embodiment has been described with reference to the drawings, but the embodiment of the invention is not restricted to that.

For example, for the disassembling method of the embodiment, at least one other arbitrarily intended step may be added according to need.

EXAMPLES

Next will be described specific examples of the embodiment.

Example 1

First, as the first base member and the second base member, respectively, there were prepared a monocrystalline silicon substrate and a quartz glass substrate, respectively, each having a length of 20 mm, a width of 20 mm, and an average thickness of 1 mm. The silicon substrate and the glass substrate were both subjected to a base treatment with oxygen plasma.

Next, there was prepared a liquid material ("KR-251" manufactured by Shin-Etsu Chemical Co., Ltd.; viscosity of 18.0 mPa·s at 25° C.) obtained by dissolving the branched compound in a solvent containing toluene and isobutanol. Using the inkjet method, the liquid material was supplied as a droplet of 5 μL on the silicon substrate to form a liquid coating film. Thereafter, the liquid coating film was allowed to stand at room temperature for two hours to dry the film so as to form a bonding film on the silicon substrate.

Then, the silicon substrate and the quartz glass substrate were superimposed on each other such that a surface of the silicon substrate having the bonding film thereon faces the quartz glass substrate.

Under the above condition, while applying a compressive force of 3 MPa between the silicon substrate and the quartz glass substrate, heat was applied at a temperature of 80° C. and the compressive force was maintained for 15 minutes. As a result, a bonded structure (a laminate) was obtained that included the silicon substrate and the quartz glass substrate bonded to each other via the bonding film.

A thin-film adhesion strength tester ("Romulus" manufactured by Quad Group showed that a bonding strength between the silicon substrate and the quartz glass substrate of the bonded structure was equal to or higher than 10 MPa.

Next, the bonding film of the obtained bonded structure was heated into a molten state at 100° C. so as to separate the quartz glass substrate from the silicon substrate.

Example 2

Excepting that the first base member was a stainless steel substrate instead of the monocrystalline silicon substrate, the same processings as Example 1 were performed to obtain a bonded structure. Thereafter, a bonding film of the bonded structure was heated into a molten state.

Similarly to Example 1, in Example 2, a bonding film (an average thickness: approximately 100 nm) was formed. A bonding strength between the stainless steel substrate and the quartz glass substrate of the bonded structure was equal to or higher than 10 MPa. Then, the bonding film of the bonded structure was heated at 100° C., whereby the quartz glass substrate was able to be separated from the stainless steel substrate.

Example 3

Using a same method as in formation of a bonding film on a monocrystalline silicon substrate, a bonding film was also formed on a quartz glass substrate. The bonding films formed on the substrates were contacted with each other to allow the substrates to be bonded to each other via the bonding films. Except as described above, in a manner similar to Example 1, there was obtained a bonded structure. Then, the bonding films of the bonded structure were heated.

Similarly to Example 1, also in Example 3, the bonding films (the average thickness: approximately 100 nm) were formed. The bonding strength between the silicon substrate and the quartz glass substrate of the bonded structure was equal to or higher than 10 MPa. The bonding films of the bonded structure thus formed were heated at 100° C. so as to separate the quartz glass substrate from the silicon substrate.

Example 4

A laminate (a bonded structure) was obtained in the same manner as in Example 1, except for using a liquid material ("SR-2410 and SR-2411" manufactured by Toray Dow Corning Silicone Co. Ltd.; viscosity of 1.20 mm²/s at 25° C.) prepared by dissolving the branched compound in a solvent containing ligroin and toluene.

In Example 4, a bonding film having the average thickness of approximately 100 nm was formed as in Example 1, and the bonding strength between a silicon substrate and a quartz glass substrate of a bonded structure was equal to or higher than 10 MPa. Then, the bonding film of the bonded structure obtained was heated at 150° C., so that the quartz glass substrate was able to be separated from the silicon substrate.

What is claimed is:

1. A method for disassembling a bonded structure obtained by bonding a first base member and a second base member to each other via a bonding film mainly made of a compound having a branched polyorganosiloxane skeleton having a structural unit expressed by a following general formula (1) at a terminal portion, a structural unit expressed by a following general formula (2) at a linking portion, and a structural unit expressed by a following general formula (3) at a branched portion:

$$\begin{array}{c} R_{3-a} \\ | \\ Si-X \\ | \\ Z_a \end{array} \quad (1)$$

$$\begin{array}{c} R_{2-b} \\ | \\ Si-X_2 \\ | \\ Z_b \end{array} \quad (2)$$

$$\begin{array}{c} R_{1-c} \\ | \\ Si-X_3 \\ | \\ Z_c \end{array} \quad (3)$$

wherein each R independently represents a non-substituted hydrocarbon group; each Z independently represents a hydroxyl group or a hydrolytic group; each X represents a siloxane residue; a represents 0 or an integer of 1 to 3; b represents 0 or an integer of 1 or 2; and c represents 0 or 1, the method comprising:

heating the bonding film into a molten state at a temperature equal to or higher than a glass transition point of the compound having the branched polyorganosiloxane skeleton; and separating the first and the second base members from each other.

2. The method for disassembling a bonded structure according to claim 1, wherein the compound having the branched polyorganosiloxane skeleton has a molecular weight ranging from $1\times10^4$ to $1\times10^6$.

3. The method for disassembling a bonded structure according to claim 1, wherein the bonding film is heated at a temperature ranging from 90 to 200° C.

4. The method for disassembling a bonded structure according to claim 1, wherein the bonded structure is obtained by supplying a liquid material mainly including the compound having the branched polyorganosiloxane skeleton on at least one of the first and the second base members to form a liquid coating film; drying the liquid coating film at a temperature not exceeding 40° C. to form the bonding film on the at least one of the first and the second base members; and applying a compressive force to both the first and the second base members in a condition where the bonding film is interposed between the base members, so as to bond the base members to each other via the bonding film.

5. The method for disassembling a bonded structure according to claim 4, wherein the bonding film is heated when applying the compressive force.

6. The method for disassembling a bonded structure according to claim 5, wherein the bonding film is heated at a temperature ranging from 40 to 200° C. when applying the compressive force.

7. The method for disassembling a bonded structure according to claim 4, wherein the liquid material is prepared using a solvent having a vapor pressure ranging from 10 to 800 Torr at 40° C.

8. The method for disassembling a bonded structure according to claim 4, wherein the compressive force ranges from 0.2 to 10 MPa.

9. The method for disassembling a bonded structure according to claim 4, wherein the bonding film formed using the liquid coating film has an average thickness ranging from 10 to 10,000 nm.

10. The method for disassembling a bonded structure according to claim 4, wherein the bonding film is formed on both the first and the second base members.

* * * * *